United States Patent
Muffler

(10) Patent No.: US 9,431,284 B2
(45) Date of Patent: Aug. 30, 2016

(54) DEVICE FOR MACHINING A SUBSTRATE AND A METHOD FOR THIS PURPOSE

(71) Applicant: solar-semi GmbH, Radolfzell (DE)

(72) Inventor: Pirmin Muffler, Orsingen-Nenzingen (DE)

(73) Assignee: solar-semi GmbH, Radolfzell (DE)

( * ) Notice: Subject to any disclaimer, the term of this patent is extended or adjusted under 35 U.S.C. 154(b) by 0 days.

(21) Appl. No.: 14/644,358

(22) Filed: Mar. 11, 2015

(65) Prior Publication Data

US 2015/0187627 A1     Jul. 2, 2015

Related U.S. Application Data

(62) Division of application No. 13/690,887, filed on Nov. 30, 2012, now Pat. No. 9,004,497.

(30) Foreign Application Priority Data

Dec. 1, 2011 (DE) .......... 10 2011 055 910
Feb. 1, 2012 (DE) .......... 10 2012 100 825

(51) Int. Cl.
| | |
|---|---|
| H01L 21/683 | (2006.01) |
| B23B 31/30 | (2006.01) |
| B25B 11/00 | (2006.01) |
| H01L 21/67 | (2006.01) |
| B44C 1/22 | (2006.01) |
| G03F 7/30 | (2006.01) |
| C09K 13/00 | (2006.01) |
| H01L 21/306 | (2006.01) |

(52) U.S. Cl.
CPC .......... *H01L 21/6838* (2013.01); *B23B 31/307* (2013.01); *B25B 11/005* (2013.01); *B44C 1/227* (2013.01); *H01L 21/67259* (2013.01); *C09K 13/00* (2013.01); *G03F 7/3021* (2013.01); *H01L 21/30604* (2013.01); *Y10S 414/141* (2013.01); *Y10T 279/11* (2015.01)

(58) Field of Classification Search
None
See application file for complete search history.

(56) References Cited

U.S. PATENT DOCUMENTS

| | | |
|---|---|---|
| 3,484,093 A | 12/1969 | Mermelstein |
| 3,730,134 A | 5/1973 | Kadi |
| 4,588,343 A | 5/1986 | Garrett |
| 5,010,295 A | 4/1991 | Lindsay |
| 5,374,829 A | 12/1994 | Sakamoto et al. |
| 5,421,595 A | 6/1995 | Cripe et al. |
| 5,492,566 A * | 2/1996 | Sumnitsch .......... H01L 21/6838 118/500 |
| 5,518,542 A * | 5/1996 | Matsukawa ............. B08B 1/007 118/232 |
| 5,565,034 A | 10/1996 | Nanbu et al. |
| 6,279,976 B1 | 8/2001 | Ball |
| 6,318,957 B1 | 11/2001 | Carr et al. |
| 6,631,935 B1 | 10/2003 | Casarotti et al. |

(Continued)

FOREIGN PATENT DOCUMENTS

| | | |
|---|---|---|
| EP | 1743220 A1 | 1/2007 |
| WO | 0247155 A1 | 6/2002 |

OTHER PUBLICATIONS

Taiwan Office Action for TW Application No. 101141285 dated Mar. 3, 2016.

*Primary Examiner* — Anita Alanko
(74) *Attorney, Agent, or Firm* — Bachman & LaPointe, P.C.

(57) ABSTRACT

In a device for machining, in particular etching and/or developing, substrates, in particular wafers, in particular etching and/or developing, having a turntable, the turntable has a Venturi gap.

3 Claims, 3 Drawing Sheets

(56) References Cited

U.S. PATENT DOCUMENTS

| | | |
|---|---|---|
| 6,669,808 B2 | 12/2003 | Adachi et al. |
| 6,672,318 B1 * | 1/2004 | Tsuchiya ............. H01L 21/6715 118/500 |
| 7,275,749 B2 * | 10/2007 | Matsuzawa ......... H01L 21/6838 118/724 |
| 7,396,022 B1 | 7/2008 | Moghadam et al. |
| 7,654,596 B2 | 2/2010 | Mantz |
| 7,661,385 B2 | 2/2010 | Hoffmann |
| 7,988,216 B2 | 8/2011 | Ku et al. |
| 2002/0064450 A1 | 5/2002 | Coomer et al. |
| 2002/0134512 A1 | 9/2002 | Adachi et al. |
| 2004/0206304 A1 * | 10/2004 | Menear ............... H01L 21/6838 118/500 |
| 2007/0063453 A1 | 3/2007 | Ishikawa et al. |
| 2007/0252970 A1 * | 11/2007 | Shibazaki ............... G03F 7/707 355/72 |
| 2009/0031955 A1 | 2/2009 | Lu et al. |
| 2012/0125376 A1 * | 5/2012 | Ohmi ................ H01L 21/67051 134/33 |

* cited by examiner

DEVICE FOR MACHINING A SUBSTRATE AND A METHOD FOR THIS PURPOSE

CROSS-REFERENCE TO RELATED APPLICATIONS

This application is a divisional application of U.S. Ser. No. 13/690,887, filed Nov. 30, 2012.

BACKGROUND OF THE INVENTION

The invention relates to a device and method for machining, in particular etching and/or developing, substrates, in particular wafers.

The prior art discloses many and various devices for machining substrates. In the field of semiconductors, in particular, rotary or spin coaters for applying photoresist to substrates are known. These rotary or spin coaters are also referred to as "coaters". Wafers or glass disks or the like are used as substrates. In addition to these "coaters", the prior art also discloses devices for machining, in particular etching and/or developing, substrates.

In this context, attention is drawn, in particular, to EP 1 743 220 A1. The device described in the prior art for the rotary coating of substrates describes a spin coater, which has a rotatable substrate table for horizontal placement of a substrate. The machining medium is distributed by rotating the substrate table. One particular problem is that the machining medium also penetrates to the rear side of the substrate to be processed and modifies it. This leads to damage to the rear side, particularly in the case of double-sided wafers.

It is the object of the invention to provide a device for machining, in particular etching and/or developing, substrates, in particular round wafers, in order to machine a wafer in such a way that the rear side thereof is not damaged and/or contaminated, and to provide a method for this purpose.

SUMMARY OF THE INVENTION

The foregoing object is achieved by providing a device for machining, in particular etching and/or developing, substrates, in particular round wafers, has a turntable, which has a Venturi gap. Compressed air or some other medium is preferably delivered through the Venturi gap. This results in several advantages. The first advantage is that, as a result, the substrate is drawn in in accordance with the Venturi principle, and is held on the turntable and not thrown off, despite the rotation of the turntable. Another advantage is that the rear side remains clean and the treatment medium cannot run onto the rear side and contaminate or damage it. This is particularly advantageous for substrates that are coated or machined on both sides.

It is expedient if the Venturi gap has a gap size of 0.01 mm to 0.1 mm, preferably 0.58 mm. Fundamentally, the gap size is dependent on the substrate thickness and size to be machined.

In typical embodiments, the device comprises a compressed air source. This has the advantage that the Venturi gap can be supplied with compressed air or pressure medium. As a particularly preferred option, the compressed medium source is suitable for producing an excess pressure of 4 to 8 bar, preferably 6 bar.

The device preferably comprises defined edges in order to achieve a defined pressure distribution, especially in the Venturi gap. As a particularly preferred option, the edges are arranged upstream of the Venturi gap.

In typical embodiments, the device comprises at least one hole. The at least one hole is preferably arranged in a central area of the turntable, said area facing a substrate. A plurality of holes is preferably arranged in the upper surface. This has the advantage that a reduced pressure or vacuum is prevented from arising between the turntable and a central area of the substrate. This is advantageous since it prevents the substrate from bending or being deformed in some other way in the central area.

In typical embodiments, the turntable has a dish shape. This has the advantage that the turntable is very robust and is easy and economical to produce.

In typical embodiments, the device has a diffuser. The diffuser is preferably inserted into an interior space of the turntable.

As a particularly preferred option, the diffuser forms the Venturi gap with the turntable. As an even more preferred option, the upper surface of the diffuser at least partially forms an area in which a vacuum can form between the wafer and the upper surface.

As a particularly preferred option, the underside of the diffuser forms an edge which ensures defined pressure distribution of the pressure medium between the upper surface of the turntable and the underside of the diffuser.

As a particularly preferred option, the device, in particular the turntable, comprises a plurality of pins, preferably three or four pins. The pins advantageously have the effect that the wafer slides into a predefined position between the pins. When the wafer is resting on one of the pins, this is detected by a sensor unit, and the machining operation is not set in motion.

In typical embodiments, the device comprises a turntable that has a plurality of grooves. The grooves are preferably arranged on a circumferential edge of the turntable. The grooves are preferably arranged in such a way that the wafer or the substrate, when correctly positioned, projects over the grooves.

In typical embodiments, the device comprises a gripper. The gripper preferably comprises a plurality of lifting pins. The lifting pins of the gripper are preferably arranged at the same angular intervals as the grooves on the turntable. The lifting pins of the gripper are preferably arranged on a diameter which corresponds to a diameter on which the grooves of the turntable are arranged. This has the advantage that the lifting pins of the gripper can engage in the grooves of the turntable, ensuring that the wafer or the substrate comes to rest on the lifting pins of the gripper.

It is furthermore advantageous that the gripper can also be used to deposit the wafer on the table without damaging the gripper.

In typical embodiments, the turntable is designed in such a way that a flow of medium or air emerging from the Venturi gap is directed in an area underneath an upper surface of the turntable. This has the advantage that better coating is achieved. This is possible because a flow over an upper surface and hence over a substrate is avoided or reduced. Reducing or avoiding a flow over the substrate ensures better application of coating. First of all, there is less turbulence in the coating medium during application. Moreover, the applied coating is not subjected to any flow either, and, as a result, a better drying result is achieved. Finally, the avoidance or reduction in flow over the upper surface of the substrate table and/or of the substrate avoids the disturbance of dirt or particles which could fall on the fresh coating.

For this purpose, the turntable preferably has a chamfer. As a particularly preferred option, the chamfer is arranged on an upper circumferential edge of the turntable, in particular a bottom part of the turntable.

The chamfer preferably has a width of 0.5 mm to 10 mm, in particular a width of 1 mm to 5 mm, preferably 3 mm. The chamfer preferably has a height of 0.5 mm to 10 mm, in particular a width of 1 mm to 5 mm, preferably 3 mm.

It is expedient if an angle formed between the axis of an upper surface of the turntable and the axis of an upper surface of the chamfer is between 5° and 85°, preferably 20 to 50°, in particular 48°.

Protection is sought separately for a method for machining, in particular etching and/or developing, substrates, in particular round wafers, comprising the following steps: rotation of the turntable, application of a machining medium to the turntable, removal of a substrate.

In typical embodiments, a slide is positioned in order to place the substrate. During this process, the substrate rests on the slide. The slide is preferably a linear motion element. It is expedient if the slide is moved in such a way that the substrate is positioned over the turntable. The gripper is then positioned under the slide and the substrate in such a way that the substrate rests on the three lifting pins of the gripper. It is expedient if the slide is removed from under the substrate, preferably by means of a linear motion. In a subsequent step, the substrate is preferably deposited on the turntable, in particular between the pins of the turntable. Deposition is preferably accomplished by means of a relative movement between the turntable and the gripper along an axis of rotation of the turntable, wherein the lifting pins of the gripper move through the grooves of the turntable.

In typical embodiments, the removal of a substrate is accomplished in a similar manner. For this purpose, a gripper is preferably positioned under the substrate on the turntable, thus enabling the lifting pins of the gripper to engage in the grooves of the turntable from below.

By virtue of a relative movement between the turntable and the gripper along an axis of rotation of the turntable, the lifting pins of the gripper engage in the grooves of the turntable, with the result that the substrate rests on three points of the gripper, and the substrate is therefore raised from the turntable.

As a particularly preferred option, the slide is positioned under the substrate, and the gripper is removed from under the substrate. The substrate is then moved with the slide away from the turntable.

The term "relative movement" is intended to indicate that it is possible both for the gripper to be moved along the axis of rotation in the direction of the turntable and for the turntable to be moved along the axis of rotation in the direction of the gripper by means of a lifting movement.

BRIEF DESCRIPTION OF THE DRAWINGS

Further advantages, features and details of the invention will become apparent from the following description of preferred embodiments and from the drawings, in which.

DETAILED DESCRIPTION

Figure 1:
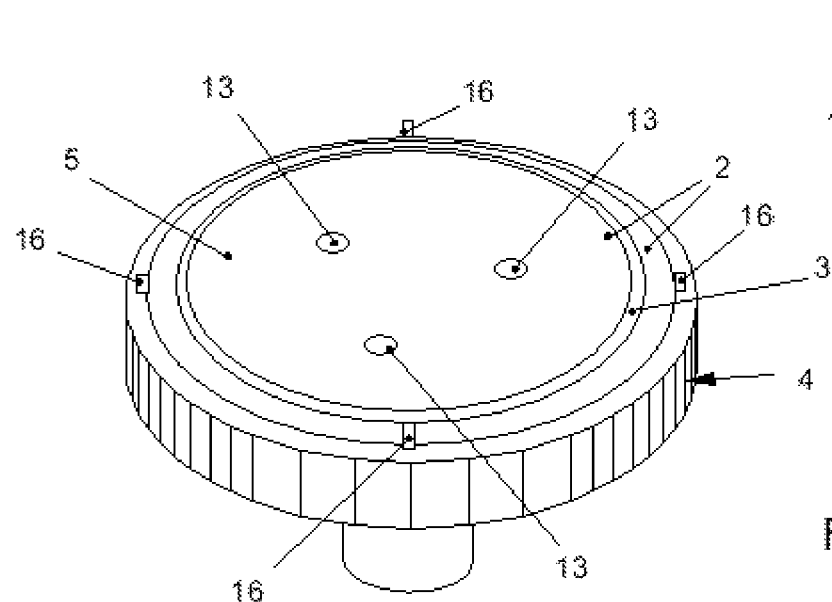
FIG. 1 shows a schematic illustration of a perspective view of a turntable of a device according to the invention.

FIG. 1 shows a turntable 1 for a device according to the invention. The turntable 1 has an upper surface 2 for a substrate, in particular a wafer. The turntable 1 has a circular shape. The turntable 1 furthermore has a Venturi gap 3. The Venturi gap 3 is arranged at the upper surface 2 of the turntable 1.

Figure 2:
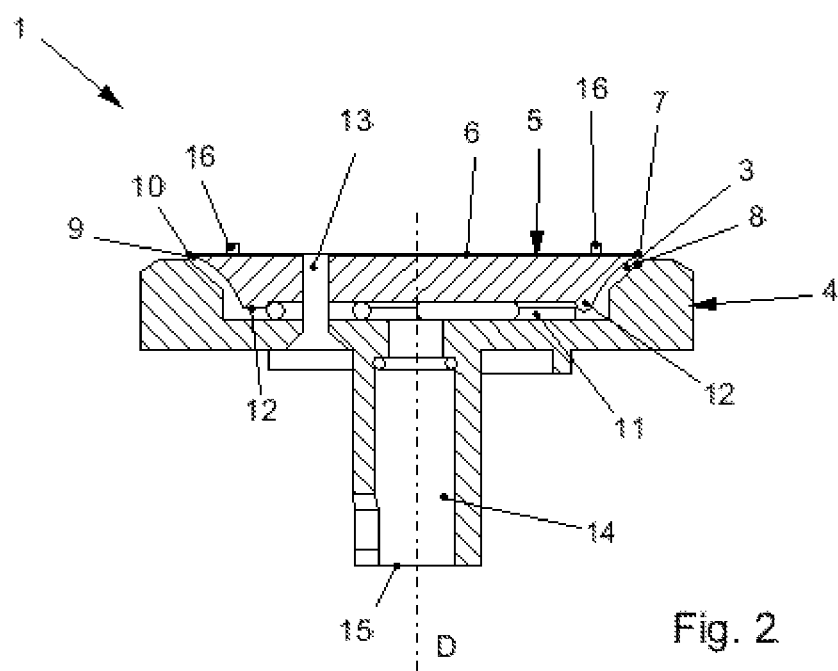
FIG. 2 shows a schematic illustration of a sectioned side view of the turntable shown in FIG. 1.

As can be seen from FIG. 2, the turntable 1 comprises a dish-shaped bottom part 4.

A diffuser 5 is inserted into the dish-shaped bottom part 4 of the turntable 1. The upper surface 6 of the diffuser 5 forms part of the upper surface 2.

The circumferential edge 7 of the diffuser 5 and an inner rim 8 of the dish-shaped bottom part 4 of the turntable form the Venturi gap 3.

In the embodiment under consideration, the Venturi gap has a height of 0.58 mm. The height is measured from a bottom part upper surface 9 of the dish-shaped bottom part 4 to an upper edge 10 of the diffuser 5.

The turntable 1 has an axis of rotation D.

The diffuser 5 is inserted into the dish-like bottom part 4 of the turntable 1 in such a way that a gap 11 is formed between the diffuser 5 and the turntable 1. Defined edges 12 project into the gap 11. The purpose of the edges 12 is to ensure a defined pressure distribution of a pressure medium, in particular compressed air, flowing through the channel 11 into the Venturi gap 3. The edges 12 are formed on an underside of the diffuser 5.

The turntable 1 furthermore comprises a plurality of holes 13. The holes 13 are introduced into the diffuser 5.

The turntable 1 has a duct 14. A compressed air or compressed medium source 33 is connected to one end 15 of the duct 14.

The turntable 1 has a plurality of pins 16. These are used to position the substrate or wafer. By virtue of the fact that the substrate comes to rest only between the pins 16, there is the advantage that precisely defined positioning between the pins can be accomplished. Moreover, this advantageously makes it possible, using a sensor device (not shown), to detect whether the substrate or wafer has come to rest in the predefined position.

The turntable according to the invention shown in FIGS. 1 and 2 operates as follows:

A substrate (not shown), in particular a round wafer, is placed on the turntable 1 of FIGS. 1 and 2.

The turntable 1 is supplied with compressed air by means of a compressed air source connected to the end 15 of the duct 14. In the process, compressed air flows into the duct 14 through the gap 11 and out of the Venturi gap 3 between the bottom part upper surface 9 of the bottom part 4 and the wafer or substrate. As a result, in accordance with the Venturi principle, a reduced pressure is produced, holding the wafer or the substrate (not shown) on the turntable 1 despite a rapid rotary motion of the turntable 1 about the axis of rotation D.

Moreover, this prevents treatment medium, e.g. etchant or developer, applied to an upper side of the substrate from running onto a rear side of the medium and damaging or modifying the latter.

Compressed air flows out of the duct 14, between the upper surface 2 and the substrate or wafer, through the holes 13. This prevents the formation, in the area of the holes 13, of a vacuum or a reduced pressure, which would bend the substrate downward, deform it and/or damage it.

Figure 3:
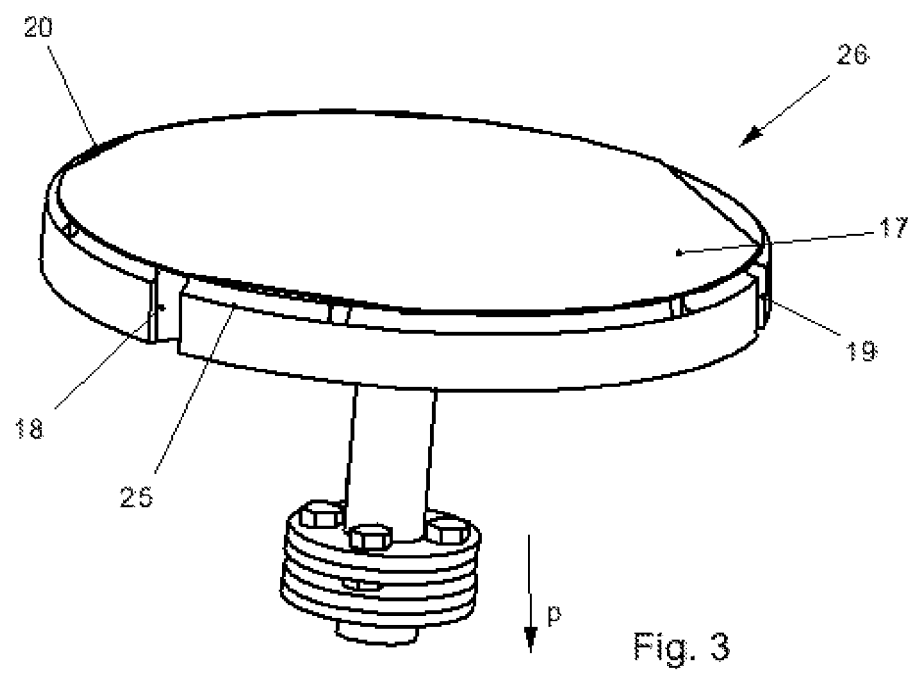
FIG. 3 shows a schematic illustration of a perspective view of a gripper for a device according to the invention.

FIG. 3 shows another embodiment of a turntable 26. Resting on the latter is a substrate 17. The construction of turntable 26 is substantially similar to that of turntable 1.

Turntable 26 furthermore has a plurality of grooves 18, 19 and 20. The grooves are introduced at a circumferential edge 25 of the turntable 26 and the length thereof corresponds to a height of the turntable.

Figure 4:
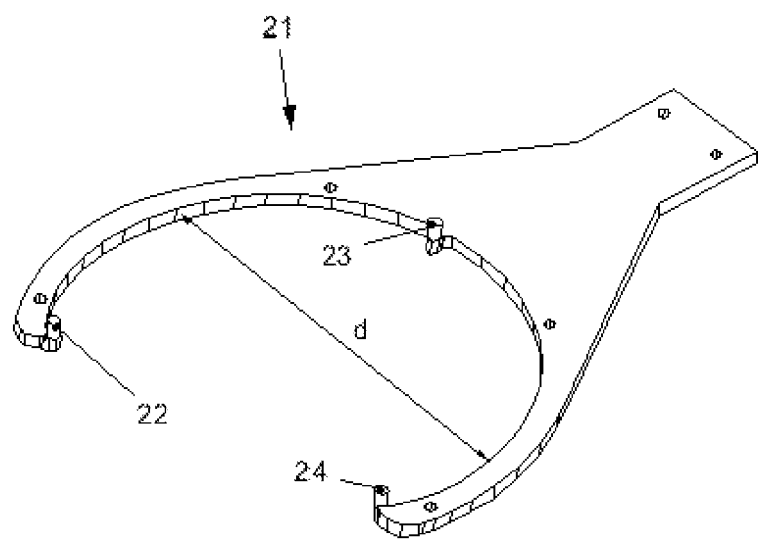
FIG. 4 shows a schematic illustration of a perspective view of another embodiment of a turntable for a device according to the invention with a wafer.

Moreover, a device according to the invention comprises a gripper 21, as illustrated in FIG. 4. The gripper 21 has three lifting pins 22, 23 and 24. The lifting pins 22 to 24 are arranged on a diameter d. The diameter d corresponds substantially to a diameter of a turntable 1 or 26.

The grooves 18, 19 and 20 are arranged at the same angular intervals as the lifting pins 22, 23 and 24. The grooves 18, 19 and 20 are preferably likewise arranged on the diameter d.

The device according to the invention having a turntable 26 operates as follows:

In order to deposit the wafer 17 on the turntable 26, it is positioned by means of a slide (not shown) at a distance above the turntable 26 which corresponds at least to the height of the slide.

The gripper 21 is then moved under the wafer 17, with the result that the wafer 17 comes to rest by its edges on the three lifting pins 22, 23 and 24.

By means of a relative movement between the turntable 26 and the gripper 21, i.e. either by lowering the gripper 21 in the direction of the turntable 26 or raising the turntable 26 in the direction of the gripper 21, the wafer 17 is then deposited on an upper surface of the turntable 26, as shown in FIG. 3. During this process, the lifting pins 22, 23 and 24 slide through the grooves 18, 19 and 20 of the turntable 26 of FIG. 3.

The gripper 21 is moved relative to the turntable 26 in such a way that the lifting pins 22, 23 and 24 can be moved downward out of the grooves 18, 19 and 20 in arrow direction P, and the gripper 21 is then removed from the turntable 26 again.

The wafer 17 can then be machined, using etchant or developer for example.

In order to remove the wafer 17 from the turntable 26, the procedure is substantially similar to that for deposition but in reverse.

The gripper 21 is positioned at the turntable 26, under the turntable 26, and is then moved with the lifting pins 22, 23 and 24 into the corresponding grooves 18, 19 and 20, counter to arrow direction P. As a result, the wafer 17 rests on the upper side of the lifting pins 22, 23 and 24 and is moved away from the turntable 26 with the gripper 21.

The slide (not shown) is then moved under the wafer 17, and the wafer 17 is removed from the area of the turntable 26 together with the slide.

Figure 5:
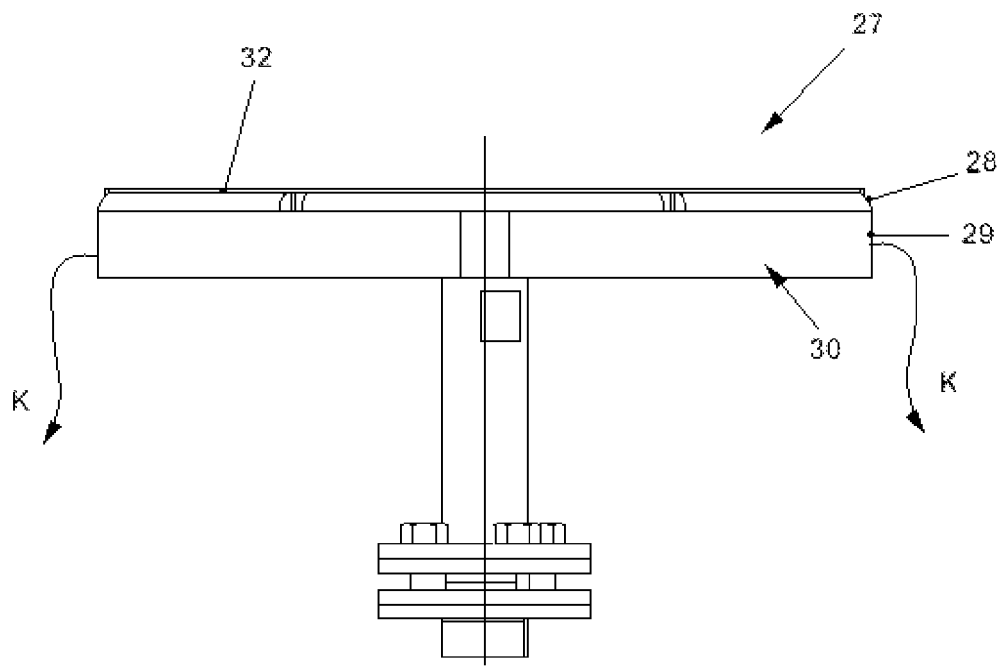
FIG. 5 shows a schematic illustration of a side view of another embodiment of a turntable of a device according to the invention.
Figure 6:
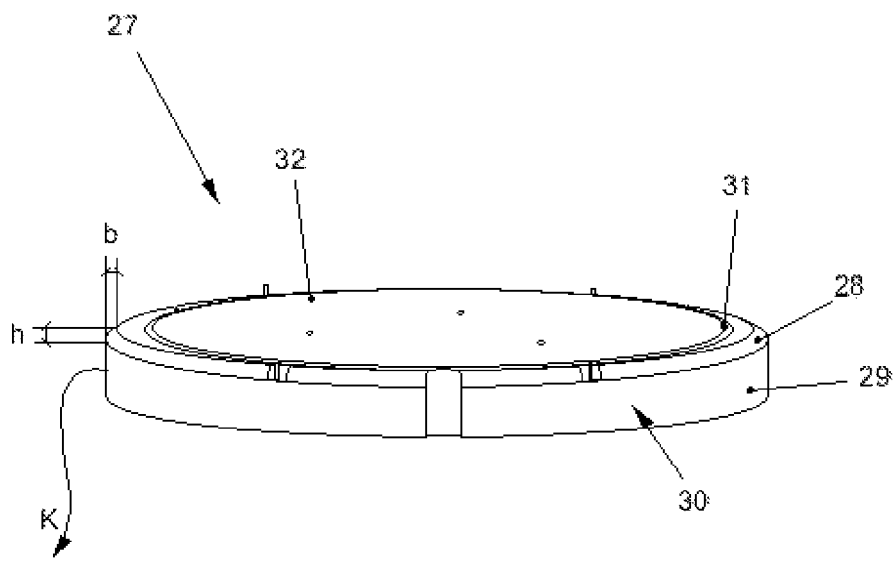
FIG. 6 shows a schematic illustration of a perspective view of the turntable shown in FIG. 5.

FIG. 5 shows another turntable 27. Turntable 27 is of substantially similar design to either of turntables 1 and 26. Turntable 27 comprises a chamfer 28. This can also be seen in the perspective illustration of the turntable 27 in FIG. 6.

With the chamfer 28, an upper edge on a circumference 29 of the turntable 27 has been removed.

The chamfer 28 is produced in a bottom part 30. Bottom part 30 is of substantially similar design to bottom part 4.

The chamfer 28 has the effect that a medium, in particular air, is blown out of a Venturi gap 31 and diverted in arrow direction K. This is advantageous because the medium, in particular the air, is directed into a region below the turntable 27. This has the advantage that unwanted air turbulence above an upper surface 32 of the turntable 27 is avoided and/or reduced. This is advantageous because better coating of a substrate is achieved as a result. This is possible because the coating is not subjected to any flow when there is a reduced flow over the upper surface of the turntable and/or of the substrate and also because fewer particles can be deposited on the coating by an air flow.

In the case of turntable 27, a flow emerging from the Venturi gap 31 is diverted in the direction of a slope of the chamfer 28 or more steeply by an upper surface 32 of the turntable 27 into an area under an upper surface of the turntable 27.

In the embodiment under consideration, the chamfer 28 has a width b of 0.5 mm to 10 mm, in particular a width of 1 mm to 5 mm, preferably 3 mm. The chamfer 28 preferably has a height h of 0.5 mm to 10 mm, in particular a width of 1 mm to 5 mm, preferably 3 mm.

The invention claimed is:

1. A method for machining a substrate comprising the steps of:
providing a turntable comprising a dish-shaped bottom plate;
locating a diffuser in the dish-shaped bottom plate wherein a Venturi gap is formed by an inner rim of the dish-shaped bottom plate and a circumferential edge of the diffuser;
providing a chamfer on a circumferential surface of the bottom plate proximate to the Venturi gap,
whereby a pressure medium emerging from the Venturi gap is directed along the chamfer and under an upper surface of the turntable;
placing a substrate on the upper surface of the turntable;
supplying the Venturi gap with a pressure medium;
rotating the substrate on the turntable;
applying a machining medium to the substrate; and
removing the substrate from the turntable.

2. The method according to claim 1, wherein the step of placing the substrate comprises the following steps:
positioning of the substrate on a slide;
movement of the slide so that the substrate is positioned over the turntable;
positioning a gripper under the substrate so that the substrate rests on three lifting pins of the gripper;
removal of the slide from under the substrate; and
deposition of the substrate on the turntable by means of a relative movement between the turntable and the gripper along an axis of rotation (D) of the turntable, wherein the lifting pins of the gripper engage in grooves at a circumferential edge of the turntable.

3. The method according to claim 1, wherein the step of removing a substrate comprises the following steps:
positioning of a gripper under the substrate on the turntable;
execution of a relative movement between the turntable and the gripper along an axis of rotation (D) of the turntable, wherein lifting pins of the gripper engage in grooves on the turntable, with the result that the substrate rests on three points of the gripper;
positioning a slide under the substrate;
removal of the gripper from under the substrate; and
movement of the slide with the substrate.

* * * * *